(12) United States Patent
Barak et al.

(10) Patent No.: US 10,572,624 B2
(45) Date of Patent: Feb. 25, 2020

(54) MODIFIED DESIGN DEBUGGING USING DIFFERENTIAL TRACE BACK

(71) Applicant: International Business Machines Corporation, Armonk, NY (US)

(72) Inventors: Erez Barak, Hod Hasharon (IL); Shlomit Koyfman, Qiryat Yam (IL); Eyal Naor, Tel-Aviv (IL); Ziv Nevo, Yokneam Ilit (IL); Osher Yifrach, Modiin (IL)

(73) Assignee: International Business Machines Corporation, Armonk, NY (US)

( * ) Notice: Subject to any disclaimer, the term of this patent is extended or adjusted under 35 U.S.C. 154(b) by 3 days.

(21) Appl. No.: 15/966,072

(22) Filed: Apr. 30, 2018

(65) Prior Publication Data

US 2019/0332741 A1    Oct. 31, 2019

(51) Int. Cl.
*G06F 17/50*    (2006.01)

(52) U.S. Cl.
CPC ........ *G06F 17/5081* (2013.01); *G06F 17/505* (2013.01)

(58) Field of Classification Search
CPC .......................... G06F 17/5081; G06F 17/505
See application file for complete search history.

(56) References Cited

U.S. PATENT DOCUMENTS

| 6,725,406 | B2 |   | 4/2004 | Kakizawa et al. |   |
|---|---|---|---|---|---|
| 7,080,333 | B1 | * | 7/2006 | Ratchev | G06F 17/5022 716/104 |
| 7,924,057 | B2 | * | 4/2011 | Verbauwhede | G06F 7/00 326/104 |
| 8,103,992 | B1 | * | 1/2012 | Chan | G06F 17/5054 716/100 |
| 9,286,426 | B2 | * | 3/2016 | Bobok | G06F 17/5045 |
| 9,336,100 | B2 |   | 5/2016 | Kolassery et al. |   |
| 9,569,345 | B2 |   | 2/2017 | Friedler et al. |   |
| 2002/0199173 | A1 | * | 12/2002 | Bowen | G06F 11/362 717/129 |

(Continued)

OTHER PUBLICATIONS

Chandrasekar et al., "A scan pattern debugger for partial scan industrial designs", Proceeding Date '12 Proceedings of the Conference on Design, Automation and Test in Europe, Mar. 2012, pp. 558-561.

(Continued)

*Primary Examiner* — Naum Levin
(74) *Attorney, Agent, or Firm* — Ziv Glazberg (57) ABSTRACT

A computer-implemented method, computerized apparatus and computer program product for modified design debugging using differential trace back. An indication of an interface signal in a time unit in an execution resulting in a value miscompare between a design and a modification thereof is obtained. For each of the design and the modification, a data record detailing each signal value in each time unit, and a structure description detailing all components and interconnections thereamong, are obtained. A suspect root cause of the value miscompare is traced back from the interface signal in the time unit, the tracing back comprising comparing values in the data records of candidate signals selected based on the data records and the structure descriptions.

20 Claims, 2 Drawing Sheets

(56) References Cited

U.S. PATENT DOCUMENTS

2015/0269049 A1    9/2015  Rohleder et al.
2019/0188349 A1*   6/2019  Ivrii .................... G06F 17/5054

OTHER PUBLICATIONS

Yu-Chin Hsu et al., "Advanced techniques for RTL debugging", Proceedings Design Automation Conference, Jun. 2003.
Smith et al., "Fault diagnosis and logic debugging using Boolean satisfiability", IEEE Transactions on Computer-Aided Design of Integrated Circuits and Systems, Oct. 2005, vol. 24, Issue 10, pp. 1606-1621.

* cited by examiner

MODIFIED DESIGN DEBUGGING USING DIFFERENTIAL TRACE BACK

TECHNICAL FIELD

The present disclosure relates to computer engineering in general, and to debugging of a modified design using differential trace back, in particular.

BACKGROUND

Computerized systems and tools nowadays aid or control almost every aspect of human life, from typing documents to managing traffic lights. However, design of computer systems, whether of software components, i.e. computer program instructions in high or low level coding, or of hardware components, such as circuits, chips, or the like, can be a complex as well as time consuming task. During the design process and also in the manufacturing stage, there is a significant likelihood that errors, defects, anomalies, and any other undesired or unexpected behaviors, colloquially referred to as "bugs", be introduced into the system. It is therefore not surprising that an integral and critical part in the development of computer systems is dedicated to the testing and debugging thereof, in which phase the bugs are expected to be discovered and rectified. Such testing typically entails performing verification of the design, namely, the correctness of the design is checked against a specification of functionalities it is required to fulfill. The testing phase is considered one of the most difficult tasks in designing a computer system. The cost of not discovering a bug prior to shipment or distribution of the design to end-users or downstream manufacturers, for example, may be enormous, as well as even lead to disastrous outcomes. For example, a bug may cause the injury of a person relying on a designated behavior of the computer system. Additionally, a bug in hardware or firmware may be expensive to fix, as patching it requires call-back of the malfunctioned component. Hence, many developers of computer systems invest a substantial portion of the development cycle to discover erroneous behaviors of the computer system in question.

BRIEF SUMMARY

One exemplary embodiment of the disclosed subject matter is a computer-implemented method comprising: obtaining an indication of an interface signal in a time unit in an execution, wherein the execution resulted in a value miscompare between a design and a modification of the design, the value miscompare being observed in the interface signal in the time unit; obtaining a first data record comprising for each time unit of the execution a value in the time unit of each signal of the design; obtaining a second data record comprising for each time unit of the execution a value in the time unit of each signal of the modification of the design; obtaining a first structure description comprising a listing of each component of the design and each interconnection of components of the design, whereby source signals for each signal of the design in each time unit are traceable; obtaining a second structure description comprising a listing of each component of the modification of the design and each interconnection of components of the modification of the design, whereby source signals for each signal of the modification of the design in each time unit are traceable; and, determining a suspect root cause of the value miscompare, the suspect root cause being an antecedent signal of the modification of the design in an antecedent time unit traced back from the interface signal in the time unit, wherein said determining comprises comparing values in the first and second data records other than in the interface signal in the time unit, wherein candidate signals which values thereof being compared are determined based on the first and second data records and the first and second structure descriptions.

Optionally, the first structure description is used to determine a type of a signal of the design, the second structure description is used to determine a type of a signal of the modification of the design, wherein responsive to a current signal in a current time unit traced back from the interface signal in the time unit being a signal of a data storing component, a corresponding candidate signal is determined based on a former signal of the data storing component in a time unit immediately preceding the current time unit, wherein said determining the suspect root cause comprising tracing back the antecedent signal in the antecedent time unit from the former signal.

Optionally, the first structure description is used to determine a type of a signal of the design, the second structure description is used to determine a type of a signal of the modification of the design, wherein responsive to a current signal in a current time unit traced back from the interface signal being a signal of a function evaluation component, a corresponding candidate signal is determined for each source signal of the function evaluation component, wherein the first and second data records are used to determine a set of source signals with a value miscompare between the design and the modification of the design, wherein said determining the suspect root cause comprising tracing back the antecedent signal in the antecedent time unit from at least one source signal in the set Optionally, the current signal in the current time unit is determined to be the suspect root cause responsive to the set being empty.

Optionally, the set is refined using a trace back process for determining source signals which values thereof being suspect causes of a value of the current signal.

Optionally, the function evaluation component is a logical gate.

Optionally, said determining a suspect root cause comprising using a root cause analysis process for determining a set of signals being suspect root causes of the value miscompare in the interface signal in the time unit, wherein candidate signals are refined based on the set.

Optionally, each time unit is a single clock cycle.

Another exemplary embodiment of the disclosed subject matter is a computerized apparatus having a processor and coupled memory, the processor being adapted to perform the steps of: obtaining an indication of an interface signal in a time unit in an execution, wherein the execution resulted in a value miscompare between a design and a modification of the design, the value miscompare being observed in the interface signal in the time unit; obtaining a first data record comprising for each time unit of the execution a value in the time unit of each signal of the design; obtaining a second data record comprising for each time unit of the execution a value in the time unit of each signal of the modification of the design; obtaining a first structure description comprising a listing of each component of the design and each interconnection of components of the design, whereby source signals for each signal of the design in each time unit are traceable; obtaining a second structure description comprising a listing of each component of the modification of the design and each interconnection of components of the modification of the design, whereby source signals for each signal of the modification of the design in each time unit are traceable; and, determining a suspect root cause of the value miscompare, the suspect root cause being an antecedent signal of the modification of the design in an antecedent time unit traced back from the interface signal in the time unit, wherein said determining comprises comparing values in the first and second data records other than in the interface signal in the time unit, wherein candidate signals which values thereof being compared are determined based on the first and second data records and the first and second structure descriptions.

Yet another exemplary embodiment of the disclosed subject matter is a computer program product comprising a non-transitory computer readable storage medium retaining program instructions, which program instructions when read by a processor, cause the processor to perform a method comprising: obtaining an indication of an interface signal in a time unit in an execution, wherein the execution resulted in a value miscompare between a design and a modification of the design, the value miscompare being observed in the interface signal in the time unit; obtaining a first data record comprising for each time unit of the execution a value in the time unit of each signal of the design; obtaining a second data record comprising for each time unit of the execution a value in the time unit of each signal of the modification of the design; obtaining a first structure description comprising a listing of each component of the design and each interconnection of components of the design, whereby source signals for each signal of the design in each time unit are traceable; obtaining a second structure description comprising a listing of each component of the modification of the design and each interconnection of components of the modification of the design, whereby source signals for each signal of the modification of the design in each time unit are traceable; and, determining a suspect root cause of the value miscompare, the suspect root cause being an antecedent signal of the modification of the design in an antecedent time unit traced back from the interface signal in the time unit, wherein said determining comprises comparing values in the first and second data records other than in the interface signal in the time unit, wherein candidate signals which values thereof being compared are determined based on the first and second data records and the first and second structure descriptions.

THE BRIEF DESCRIPTION OF THE SEVERAL VIEWS OF THE DRAWINGS

The present disclosed subject matter will be understood and appreciated more fully from the following detailed description taken in conjunction with the drawings in which corresponding or like numerals or characters indicate corresponding or like components. Unless indicated otherwise, the drawings provide exemplary embodiments or aspects of the disclosure and do not limit the scope of the disclosure. In the drawings.

DETAILED DESCRIPTION

One technical problem dealt with by the disclosed subject matter is to find a malfunctioning component of a design that has undergone a modification which resulted in an erroneous output or other observed behavior. A design that has been verified for correctness may be subject to one or more modifications, aimed at optimizing its performance, e.g. speeding up calculations, conserving resources such as power consumption or storage space, reducing volume or weight dimensions, and the like. In many cases, such optimizations may be expected to preserve the original functionality of the design, at least in terms of its exhibited behavior. A considerable verification effort may therefore be dedicated to make sure that functionality indeed being preserved following a modification.

One approach to functionality preservation verification is to simulate both versions of the design, with and without the modification, on a same set of test cases, e.g. an identical set of inputs, and then compare the results. Another approach is to perform sequential equivalence checking between the original and modified versions of the design. Equivalence checking is a process in which two representations of a design are formally proved to be functionally identical, i.e. exhibit the exact same behavior. Upon detection using either one of these techniques of an execution path that leads to a miscompare, i.e. a difference in behavior exhibited by the two versions of the design, a corresponding data record may be produced for each version, wherein each of which data records may comprise detailing of a value of each component of the respective design version in each given time unit, e.g. a single clock cycle, on the given execution path. An overall set of values of all components of a design or portion thereof at a particular time unit may also be referred to herein by the term "design state" or "internal state", whereas a value of a particular component at a particular time may be referred to herein by the term "design signal". A subset of which values being also observable to an external entity, such as, for example, a checker used to verify correctness of the design version or the like, may be referred to by the term "observed state", whereas a particular observed value at a particular time may be referred to by the term "interface signal". A data record which holds values for each design signal at each clock cycle on a given execution path may also be referred to by the term "wave file". One may expect the two wave files, as generated for example in response to a miscompare detection, to disagree on at least one value of a specific observed interface signal at a specific cycle.

Debugging miscompares may be a time consuming and tedious task. In some cases a miscompare in an observed interface signal may be only a symptom for a much deeper bug in functioning of an internal design signal. A wrong value in the internal buggy signal may propagate to the interface signal through a long path of other internal signals and across multiple clock cycles. Tracing back a miscompare from its manifestation at an interface signal to its root cause in a buggy internal signal may be an essential part of debugging miscompares.

In recent years, several techniques have been presented for automating root cause identification, for functional bugs in general, and for value miscompares in particular. One approach proposed is discussed in K. Chandrasekar, S. K. Misra, S. Sengupta, M. S. Hsiao, "A Scan Pattern Debugger for Partial Scan Industrial Designs", DATE 2012, which is hereby incorporated by reference in its entirety without giving rise to disavowment. This approach uses a data structure referred to as "Debug Implication Graph" which is built during a simulation that exhibited a failure. The nodes in the graph correspond to gate evaluations at various cycles, and a directed edge signifies that the gate at the source of the edge influenced the value of the gate at the edge destination.

It is then possible to follow a chain of "cause and effect" edges from a wrong value on an interface signal back to its root cause. Another similar approach is discussed in Y. C. Hsu, B. Tabbara, Y. A. Chen, F. Tsai, "Advanced techniques for RTL debugging", DAC 2003, which is hereby incorporated by reference in its entirety without giving rise to disavowment. In this approach, referred to herein as trace value cause, a similar graph is built but in a lazier way. The tracing back starts from the faulty signal, and only when a need arises to trace a value back to a suspect cause, a combined analysis of the wave file and netlist, i.e. a structural description of the design listing all components thereof and interconnections among those components, is performed to identify the signals that might have caused the value in question to appear for the signal at hand. Yet another approach proposed is discussed in: A. Smith, A. G. Veneris, M. F. Ali, and A. Viglas, "Fault diagnosis and logic debugging using Boolean satisfiability". IEEE Trans. on CAD of Integrated Circuits and Systems, 2005, which is hereby incorporated by reference in its entirety without giving rise to disavowment. This approach, referred to herein as SAT-based fault diagnosis, provides a formulation as a Boolean satisfiability problem (SAT) and utilizes a SAT solver to identify signals for which a change in their behavior can fix the observed miscompare. The signals thus identified are reported as suspect root cause signals. In the context of the present disclosure, the first two approaches and any likewise techniques are colloquially referred to as trace back methods, while the third approach and any likewise techniques are referred to as root cause analysis methods.

One technical solution is to use miscompares between values of corresponding signals of a design before and after a modification, in aid of tracing back an observed miscompare in an interface signal to a possible root cause thereof. A suspect root cause signal may be traced back in an iterative procedure, wherein for a current signal being processed, only source signals in which a miscompare is found between the two design versions are selected for further processing. A structural description detailing all components of a design and interconnections thereamong, such as a netlist or the like, may be obtained for each of the original and modified design versions. The structural is description may be used to identify all sources of a current signal, in either one of the design or modification thereof, respectively. A data record detailing the value of each design signal in each time unit along the execution, e.g. in each clock cycle, such as a wave file or the like, may be obtained for each of the correct and faulty design versions. The two data records may be used to compare values of corresponding signals of the two design versions in corresponding time units, so as to identify a miscompare in a source of a current signal.

In some exemplary embodiments, components of a design and signals thereof may comprise different types, such as, for example, function evaluation components, data storing components, and the like. A function evaluation component may be a logical gate or likewise element, such as, for example, AND, OR, NOT, or XOR gate. A data storing component may be either a state-holding element, such as a latch, register, flip-flop, and the like, or it may be an array, e.g. a Random Access Memory (RAM) or the like. A type of a current signal may be determined using the structural description of the respective design version. In case the current signal is of a data storing component, a cause for a value thereof may be traced back to a signal of the data storing component in an immediately preceding time unit, e.g. one clock cycle back. Tracing back the signal value one time unit earlier may be done using the respective data record of all design signals in all time units of the execution. Alternatively, if the current signal is of a function evaluation component, its source signals may be traced back using the structural description of the respective design version.

The iterative tracing back procedure may end in case that no sources with miscompares are found for the current signal. The current signal may then be outputted as a suspect root cause. The procedure may either halt in that point or continue by going back to a function evaluation component previously traversed wherein multiple miscompared sources were identified, and selecting a miscompared source not yet explored. The traversal of miscompared sources in tracing back of a suspect root cause may be performed in a Breadth-first search (BFS) order, a Depth-first search (DFS) order, or the like.

In some exemplary embodiments, a set of source signals identified for a current signal may be refined using trace back methods, such as trace value cause or the like, whereby source signals with values suspect of being a cause for appearance of a particular value of the current signal may be determined. In this way, exploration of miscompared sources that could not have influenced on the value of the current signal may be avoided. Additionally or alternatively, identification of a suspect root cause signal may be refined using root cause analysis methods, such as SAT-based fault diagnosis or the like.

One technical effect of utilizing the disclosed subject matter is to conserve time and computing resources in debugging of miscompares, by limiting tracing back of a suspect root cause for a signal to miscompared sources, thus avoiding exploration of signals which have a same value in both the pre- and post-modification design version. Such equivalence in exhibited behavior of corresponding signals in corresponding time units may be determined based on wave files or likewise data records of the two versions. It will be appreciated that the disclosed subject matter utilizes a wave file or a likewise data record of the correct (e.g. un-optimized) design, not only for detection of a miscompare in an observed interface signal, but also for improving the tracing back process, contrast to pre-existing techniques. It will further be appreciated that the disclosed subject matter is not meant to be limited to hardware design debugging necessarily, but rather it may be useful also for debugging software systems, wherein tracing back function calls that resulted in a miscompare to a root cause error may be performed only for those function arguments that differ between the correct and faulty executions, thus limiting the search space and effort significantly.

The disclosed subject matter may provide for one or more technical improvements over any pre-existing technique and any technique that has previously become routine or conventional in the art. Additional technical problem, solution and effects may be apparent to a person of ordinary skill in the art in view of the present disclosure.

Figure 1:
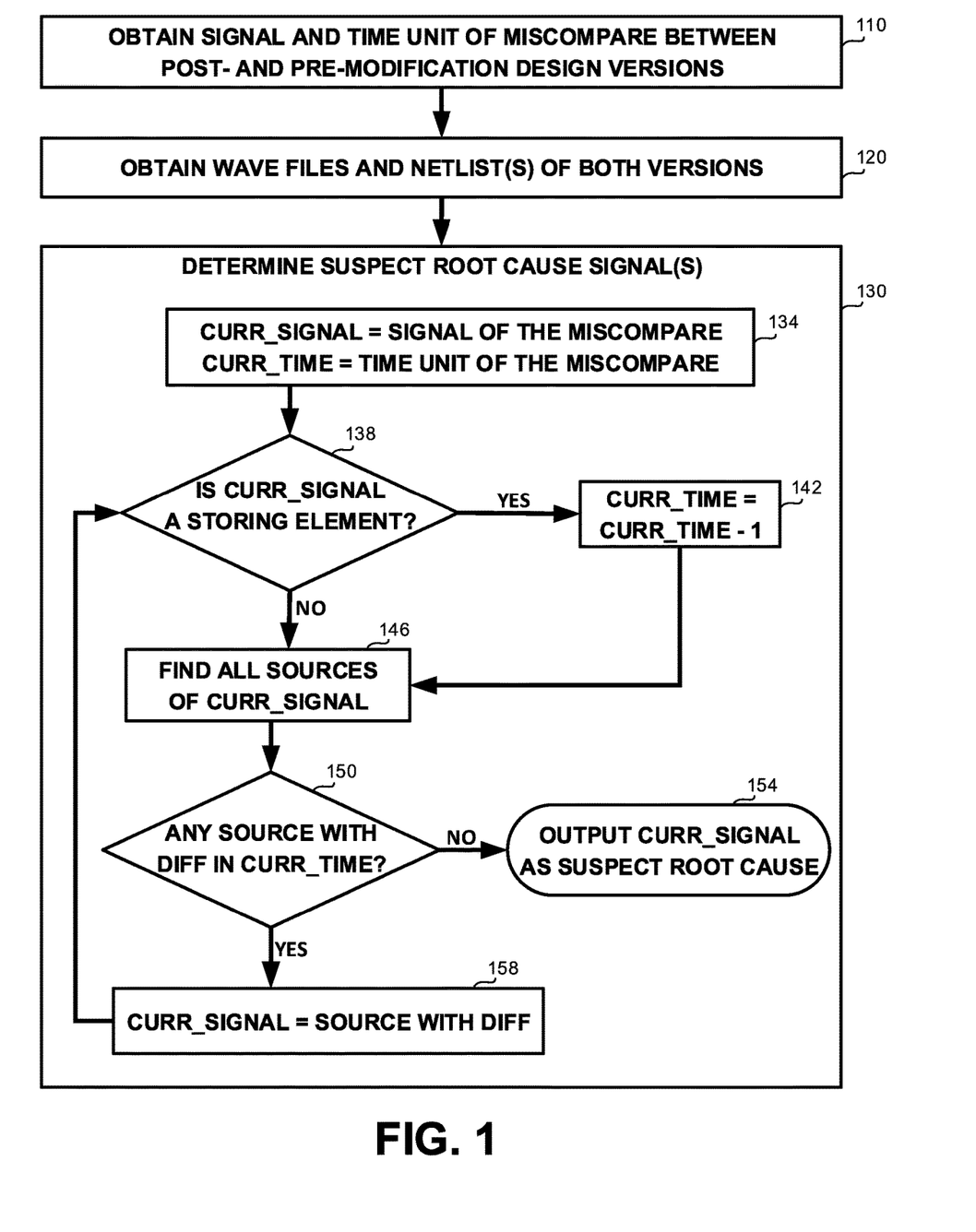
FIG. 1 shows a flowchart diagram of a method, in accordance with some exemplary embodiments of the disclosed subject matter.

Referring now to FIG. 1 showing a flowchart diagram of a method, in accordance with some exemplary embodiments of the disclosed subject matter.

On Step 110, an indication of a signal and a time unit in which a miscompare between a post- and pre-modification design versions is observed may be obtained. The modification may be an optimization to an original version of a design, wherein the original version is known to be correct, i.e. exhibits behavior conforming specification. The signal in which the miscompare is observed may be an interface signal. The time unit s may be a clock cycle or any likewise program count of an execution.

On Step 120, for each of the modified and un-modified design versions, a wave file or likewise data record detailing each signal of the design in each time unit throughout the execution, and a netlist or likewise structural description detailing all components of the design and interconnections thereamong, may be obtained. In some exemplary embodiments, both the design and its modification may have an identical netlist. For example, the modification may be in a form of an optimization that selectively provides power to different parts of the design, such that only components performing a task are turned on while the remainder are turned off. In such a scenario, a miscompare may result from a component being mistakenly turned off while it should have been on.

On Step 130, one or more suspect root cause signals that may have led to the miscompare may be traced back from the signal and time unit indicated on Step 110. For this purpose, an iterative procedure as in Steps 134 to 158 may be performed. In some exemplary embodiments, a root cause analysis method, such as SAT-based fault diagnosis, may be performed to obtain an initial set of suspect root causes. This set may be used to refine identification of root cause signals through the iterative procedure of Steps 134 to On Step 134, the signal and time unit in which the miscompare is observed as obtained in Step 110 may be designated as a current signal and a current time unit, respectively.

On Step 138, a determination whether the current signal is a signal of a storing element, e.g. a latch, register, flip-flop, array or the like, may be made, based on the respective netlist as obtained in Step 120.

On Step 142, in case the current signal is determined in Step 138 to be of a storing element, the current time unit is set one step back to the time unit immediately preceding it.

On Step 146, in case the determination in Step 138 is that the current signal is not of a storing element, i.e. the current signal is of a function evaluation element, all sources of the current signal may be tracked and identified. In some exemplary embodiments, the set of sources may be refined using a trace back method, whereby sources which values thereof could not have influenced on the value of the current signal in the current time unit may be excluded from further exploration.

On Step 150, a determination whether for any source of the current signal a different value in the post- and pre-modification design versions is exhibited in the current time unit, based on the data in the wave files obtained in Step 120.

On Step 154, in case no sources of the current signal with differing values in the current time in each of the design versions are identified in Step 150, the current signal may be outputted as a suspect root cause signal. The procedure may either stop or set the current signal and time unit to a miscompared source previously detected in Step 150 but not yet explored, and go back to Step 138.

On Step 158, in case one or more sources of the current signal with differing values are found in Step 150, the current signal is set to a source in which a difference, i.e. miscompare is found and the procedure may go back to Step 138. The procedure in Steps 138 to 158 may be performed iteratively either until a suspect root cause is detected or until all miscompared sources detected in Step 150 have been explored.

Figure 2:
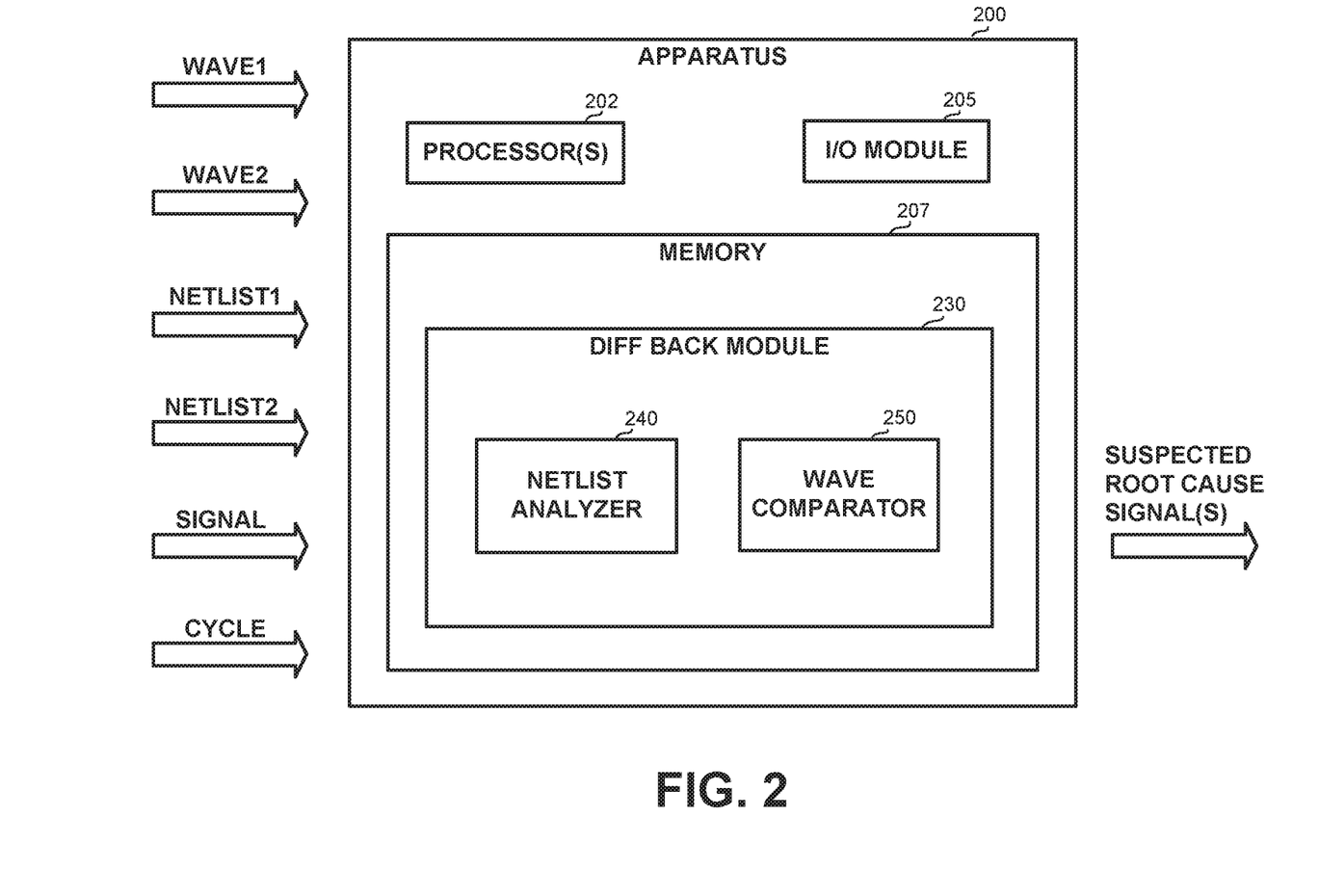
FIG. 2 shows a block diagram of an apparatus, in accordance with some exemplary embodiments of the disclosed subject matter.

Referring now to FIG. 2 showing a block diagram of an apparatus, in accordance with some exemplary embodiments of the disclosed subject matter. An Apparatus 200 may be configured to support parallel user interaction with a real world physical system and a digital representation thereof, in accordance with the disclosed subject matter.

In some exemplary embodiments, Apparatus 200 may comprise one or more Processor(s) 202. Processor 202 may be a Central Processing Unit (CPU), a microprocessor, an electronic circuit, an Integrated Circuit (IC) or the like. Processor 202 may be utilized to perform computations required by Apparatus 200 or any of it subcomponents.

In some exemplary embodiments of the disclosed subject matter, Apparatus 200 may comprise an Input/Output (I/O) module 205. I/O Module 205 may be utilized to provide an output to and receive input from a user, such as, for example, obtain indication of a signal and time unit in which a miscompare is observed, obtain structural descriptions and execution data records of post- and pre-modification design versions, report suspect root cause signals detected, or the like.

In some exemplary embodiments, Apparatus 200 may comprise Memory 207.

Memory 207 may be a hard disk drive, a Flash disk, a Random Access Memory (RAM), a memory chip, or the like. In some exemplary embodiments, Memory 207 may retain program code operative to cause Processor 202 to perform acts associated with any of the subcomponents of Apparatus 200.

Diff Back Module 230 may be configured to determine one or more suspect root causes of a miscompare in a signal in a time unit (e.g. a clock cycle) as indicated in an input, similarly as in Step 130 of FIG. 1. Diff Back Module 230 may receive an indication of the signal and time unit, similarly as in Step 110 of FIG. 1, from either a user or an automated tool, such as for example a checker or likewise design verification tool that detected a mismatch between an observed interface signal of a modified design and its expected value under the specification. In some exemplary embodiments, Diff Back Module 230 may be configured to obtain, for each of the modified design and pre-modification version thereof, a wave file or equivalent data record, and a netlist or equivalent structure description, similarly as in Step 120 of FIG. 1.

Net Analyzer 240 may be configured to determine source signals of a current signal in a current time unit, similarly as in Step 146 of FIG. 1. Net Analyzer 240 may determine the source signals based on the respective netlist as obtained by Diff Back Module 230. In some exemplary embodiments, Net Analyzer 240 may be further configured to determine whether the current signal is of a storing element, similarly as in Step 138 of FIG. 1. Diff Back Module 230 may be configured to set the current time unit back one step responsive to determination by Net Analyzer 240 that the current signal is of a storing element, similarly as in Step 142 of FIG. 1.

Wave Comparator 250 may be configured to compare values of corresponding signals in corresponding time units of the post- and pre-modification design versions, based on the data in the wave files thereof as obtained by Diff Back Module 230. Wave Comparator 250 may indicate to Diff Back Module 230 whether a miscompare is found for a specified signal in a specified time unit. For example, Wave Comparator 250 may be utilized to determine whether any sources of a current signal in a current time unit have differing values in the two design versions, i.e. identify miscompared sources, similarly as in Step 150 of FIG. 1. Wave Comparator 250 may be utilized by Diff Back Module 230 in conjunction with Net Analyzer 240, wherein interleaved calls to Net Analyzer 240 and Wave Comparator 250 may be made by Diff Back Module 230, whereby allowing for an iterative trace back from the observed interface signal to a suspect root cause, considering only signals that miscompare at the right time. In some exemplary embodiments, Diff Back Module 230 may be configured to stop and output the current signal responsive to obtaining an indication from Wave Comparator 250 that no source thereof miscompares at the relevant time (cycle), similarly as in Step 154 of FIG. 1. Otherwise, responsive to a miscompared source indication from Wave Compartor 250, Diff Back Module 230 may set the current signal to the miscompared source and continue to trace back a suspect root cause, similarly as in Step 158 of FIG. 1. In some further exemplary embodiments, Diff Back Module 230 may get back to a signal for which Wave Comparator 250 detected multiple miscompared sources and select therefrom one not yet explored, to be a current signal from which the iterative trace back may proceed.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or tan external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made tan external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and tenable others of ordinary skill in the art to understand the invention for various embodiments with various modifications as are suited to the particular use contemplated.

What is claimed is:

1. A computer-implemented method comprising:
   obtaining an indication of an interface signal in a time unit in an execution, wherein the execution resulted in a value miscompare between a design and a modification of the design, the value miscompare being observed in the interface signal in the time unit;
   obtaining a first data record comprising for each time unit of the execution a value in the time unit of each design signal of the design;
   obtaining a second data record comprising for each time unit of the execution a value in the time unit of each design signal of the modification of the design;
   obtaining a first structure description comprising a listing of each component of the design and each interconnection of components of the design, whereby source signals for each design signal of the design in each time unit are traceable;
   obtaining a second structure description comprising a listing of each component of the modification of the design and each interconnection of components of the modification of the design, whereby source signals for each design signal of the modification of the design in each time unit are traceable; and,
   determining a suspect root cause of the value miscompare, the suspect root cause being an antecedent signal of the modification of the design in an antecedent time unit traced back from the interface signal in the time unit, wherein said determining comprises comparing values in the first and second data records other than in the interface signal in the time unit, wherein candidate signals which values thereof being compared are determined based on the first and second data records and the first and second structure descriptions.

2. The computer-implemented method of claim 1, wherein the first structure description is used to determine a type of a signal of the design, wherein the second structure description is used to determine a type of a signal of the modification of the design, wherein responsive to a current signal in a current time unit traced back from the interface signal in the time unit being a signal of a data storing component, a corresponding candidate signal is determined based on a former signal of the data storing component in a time unit immediately preceding the current time unit, wherein said determining the suspect root cause comprising tracing back the antecedent signal in the antecedent time unit from the former signal.

3. The computer-implemented method of claim 1, wherein the first structure description is used to determine a type of a signal of the design, wherein the second structure description is used to determine a type of a signal of the modification of the design, wherein responsive to a current signal in a current time unit traced back from the interface signal being a signal of a function evaluation component, a corresponding candidate signal is determined for each source signal of the function evaluation component, wherein the first and second data records are used to determine a set of source signals with a value miscompare between the design and the modification of the design, wherein said determining the suspect root cause comprising tracing back the antecedent signal in the antecedent time unit from at least one source signal in the set.

4. The computer-implemented method of claim 3, wherein the current signal in the current time unit is determined to be the suspect root cause responsive to the set being empty.

5. The computer-implemented method of claim 3, wherein the set is refined using a trace back process for determining source signals which values thereof being suspect causes of a value of the current signal.

6. The computer-implemented method of claim 3, wherein the function evaluation component is a logical gate.

7. The computer-implemented method of claim 1, wherein said determining a suspect root cause comprising using a root cause analysis process for determining a set of signals being suspect root causes of the value miscompare in the interface signal in the time unit, wherein candidate signals are refined based on the set.

8. The computer-implemented method of claim 1, wherein each time unit is a single clock cycle.

9. A computerized apparatus having a processor and coupled memory, the processor being adapted to perform the steps of:
   obtaining an indication of an interface signal in a time unit in an execution, wherein the execution resulted in a value miscompare between a design and a modification of the design, the value miscompare being observed in the interface signal in the time unit;
   obtaining a first data record comprising for each time unit of the execution a value in the time unit of each design signal of the design;
   obtaining a second data record comprising for each time unit of the execution a value in the time unit of each design signal of the modification of the design;
   obtaining a first structure description comprising a listing of each component of the design and each interconnection of components of the design, whereby source signals for each design signal of the design in each time unit are traceable;

obtaining a second structure description comprising a listing of each component of the modification of the design and each interconnection of components of the modification of the design, whereby source signals for each design signal of the modification of the design in each time unit are traceable; and, determining a suspect root cause of the value miscompare, the suspect root cause being an antecedent signal of the modification of the design in an antecedent time unit traced back from the interface signal in the time unit, wherein said determining comprises comparing values in the first and second data records other than in the interface signal in the time unit, wherein candidate signals which values thereof being compared are determined based on the first and second data records and the first and second structure descriptions.

10. The computerized apparatus of claim 9, wherein the first structure description is used to determine a type of a signal of the design, wherein the second structure description is used to determine a type of a signal of the modification of the design, wherein responsive to a current signal in a current time unit traced back from the interface signal in the time unit being a signal of a data storing component, a corresponding candidate signal is determined based on a former signal of the data storing component in a time unit immediately preceding the current time unit, wherein said determining the suspect root cause comprising tracing back the antecedent signal in the antecedent time unit from the former signal.

11. The computerized apparatus of claim 9, wherein the first structure description is used to determine a type of a signal of the design, wherein the second structure description is used to determine a type of a signal of the modification of the design, wherein responsive to a current signal in a current time unit traced back from the interface signal being a signal of a function evaluation component, a corresponding candidate signal is determined for each source signal of the function evaluation component, wherein the first and second data records are used to determine a set of source signals with a value miscompare between the design and the modification of the design, wherein said determining the suspect root cause comprising tracing back the antecedent signal in the antecedent time unit from at least one source signal in the set.

12. The computerized apparatus of claim 9, wherein the current signal in the current time unit is determined to be the suspect root cause responsive to the set being empty.

13. The computerized apparatus of claim 9, wherein the set is refined using a trace back process for determining source signals which values thereof being suspect causes of a value of the current signal.

14. The computerized apparatus of claim 9, wherein said determining a suspect root cause comprising using a root cause analysis process for determining a set of signals being suspect root causes of the value miscompare in the interface signal in the time unit, wherein candidate signals are refined based on the set.

15. A computer program product comprising a non-transitory computer readable storage medium retaining program instructions, which program instructions when read by a processor, cause the processor to perform a method comprising:

obtaining an indication of an interface signal in a time unit in an execution, wherein the execution resulted in a value miscompare between a design and a modification of the design, the value miscompare being observed in the interface signal in the time unit;

obtaining a first data record comprising for each time unit of the execution a value in the time unit of each design signal of the design;

obtaining a second data record comprising for each time unit of the execution a value in the time unit of each design signal of the modification of the design;

obtaining a first structure description comprising a listing of each component of the design and each interconnection of components of the design, whereby source signals for each design signal of the design in each time unit are traceable;

obtaining a second structure description comprising a listing of each component of the modification of the design and each interconnection of components of the modification of the design, whereby source signals for each design signal of the modification of the design in each time unit are traceable; and, determining a suspect root cause of the value miscompare, the suspect root cause being an antecedent signal of the modification of the design in an antecedent time unit traced back from the interface signal in the time unit, wherein said determining comprises comparing values in the first and second data records other than in the interface signal in the time unit, wherein candidate signals which values thereof being compared are determined based on the first and second data records and the first and second structure descriptions.

16. The computer program product of claim 15, wherein the first structure description is used to determine a type of a signal of the design, wherein the second structure description is used to determine a type of a signal of the modification of the design, wherein responsive to a current signal in a current time unit traced back from the interface signal in the time unit being a signal of a data storing component, a corresponding candidate signal is determined based on a former signal of the data storing component in a time unit immediately preceding the current time unit, wherein said determining the suspect root cause comprising tracing back the antecedent signal in the antecedent time unit from the former signal.

17. The computer program product of claim 15, wherein the first structure description is used to determine a type of a signal of the design, wherein the second structure description is used to determine a type of a signal of the modification of the design, wherein responsive to a current signal in a current time unit traced back from the interface signal being a signal of a function evaluation component, a corresponding candidate signal is determined for each source signal of the function evaluation component, wherein the first and second data records are used to determine a set of source signals with a value miscompare between the design and the modification of the design, wherein said determining the suspect root cause comprising tracing back the antecedent signal in the antecedent time unit from at least one source signal in the set.

18. The computer program product of claim 15, wherein the current signal in the current time unit is determined to be the suspect root cause responsive to the set being empty.

19. The computer program product of claim 15, wherein the set is refined using a trace back process for determining source signals which values thereof being suspect causes of a value of the current signal.

20. The computer program product of claim 15, wherein said determining a suspect root cause comprising using a root cause analysis process for determining a set of signals being suspect root causes of the value miscompare in the interface signal in the time unit, wherein candidate signals are refined based on the set.

\* \* \* \* \*